US009091932B2

(12) United States Patent
Accardi et al.

(10) Patent No.: US 9,091,932 B2
(45) Date of Patent: Jul. 28, 2015

(54) THREE-DIMENSIONAL INTEGRATED STRUCTURE HAVING A HIGH SHAPE FACTOR, AND RELATED FORMING METHOD

(75) Inventors: Corrado Accardi, Ragusa (IT); Stella Loverso, Catania (IT); Sebastiano Ravesi, Catania (IT); Noemi Graziana Sparta, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 308 days.

(21) Appl. No.: 13/604,397

(22) Filed: Sep. 5, 2012

(65) Prior Publication Data

US 2013/0071611 A1    Mar. 21, 2013

(30) Foreign Application Priority Data

Sep. 21, 2011    (IT) .............................. MI2011A1703

(51) Int. Cl.
*G03F 7/32*    (2006.01)
(52) U.S. Cl.
CPC ........... *G03F 7/32* (2013.01); *Y10T 428/24174* (2015.01); *Y10T 428/24802* (2015.01)
(58) Field of Classification Search
CPC .................................... G03F 7/26; G03F 7/32
USPC ......................................... 430/311, 322, 331
See application file for complete search history.

(56) References Cited

U.S. PATENT DOCUMENTS

| 4,360,585 | A | 11/1982 | Frank et al. |
| 5,122,387 | A | 6/1992 | Takenaka et al. |
| 5,624,782 | A | * | 4/1997 | Hayakawa et al. ........... 430/198 |

FOREIGN PATENT DOCUMENTS

| JP | 55110243 | A | 8/1980 |
| JP | 2009075261 | A | 4/2009 |

OTHER PUBLICATIONS

Italian Search Report for IT MI201101703, issued on Jun. 15, 2012, 7 pages.
Database WPI, AN 1980-72253C, Thomson Scientific, London, GB, XP002677840 & JP 55 110243 (Nippon Electric Co), Aug. 25, 1980.
Stephan, K., "Fast prototyping using a dry film photoresist: microfabrication of soft-lithography masters for microfluidic structures," J. Micromech. Microeng. 17:N69-N74, 2007.

* cited by examiner

*Primary Examiner* — Kathleen Duda
(74) *Attorney, Agent, or Firm* — Seed IP Law Group PLLC

(57) ABSTRACT

The disclosure relates to a three-dimensional integrated structure comprising a substrate and a plurality of projecting elements projecting from a flat surface thereof and obtained from a patterned and developed dry film photoresist. Advantageously, the three-dimensional integrated structure is highly defined, the projecting elements obtained by the patterned and developed dry film photoresist having a shape factor greater than 6. The three-dimensional integrated structure can be used to directly realize different type of electronic devices, such as microfluidic devices, microreactors or sensor devices.

4 Claims, 6 Drawing Sheets

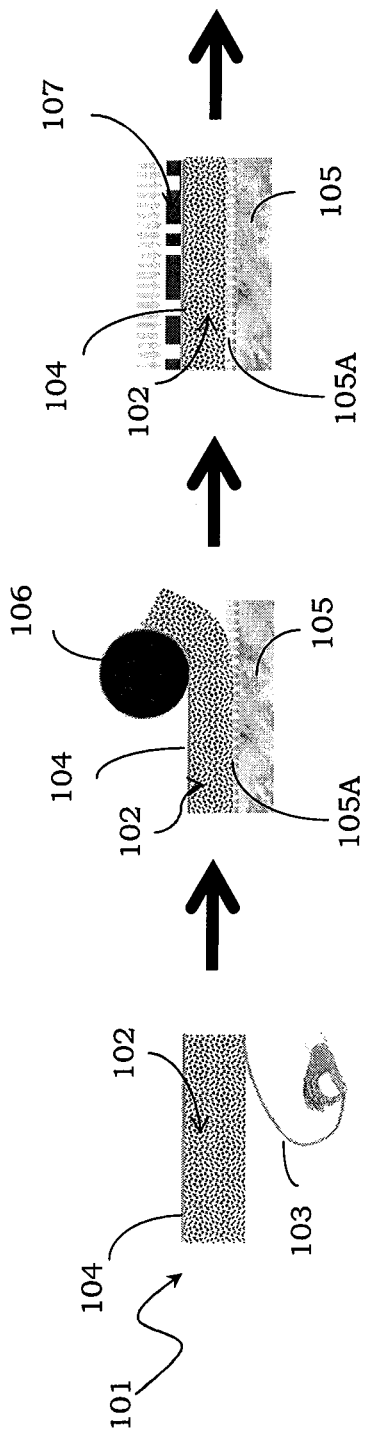
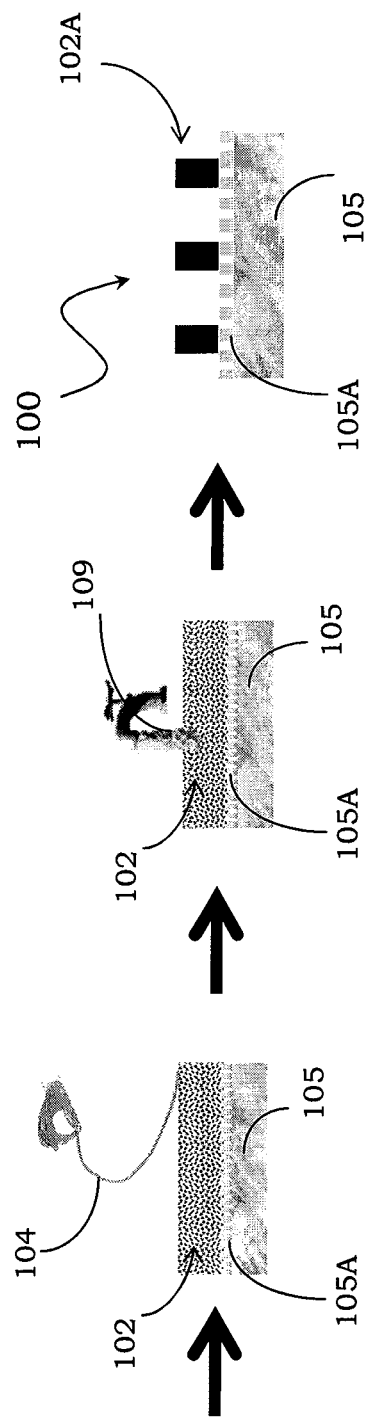

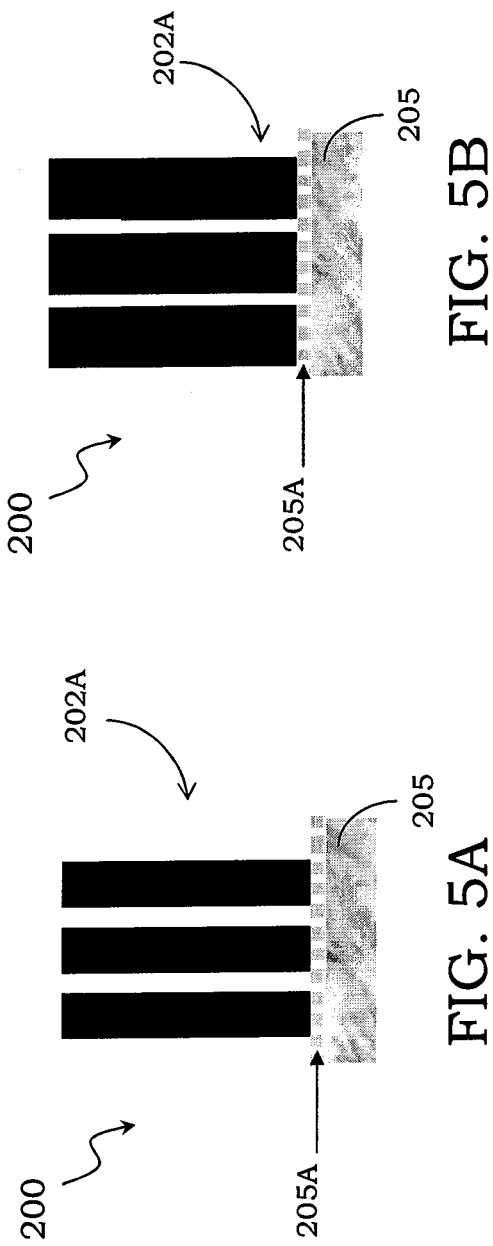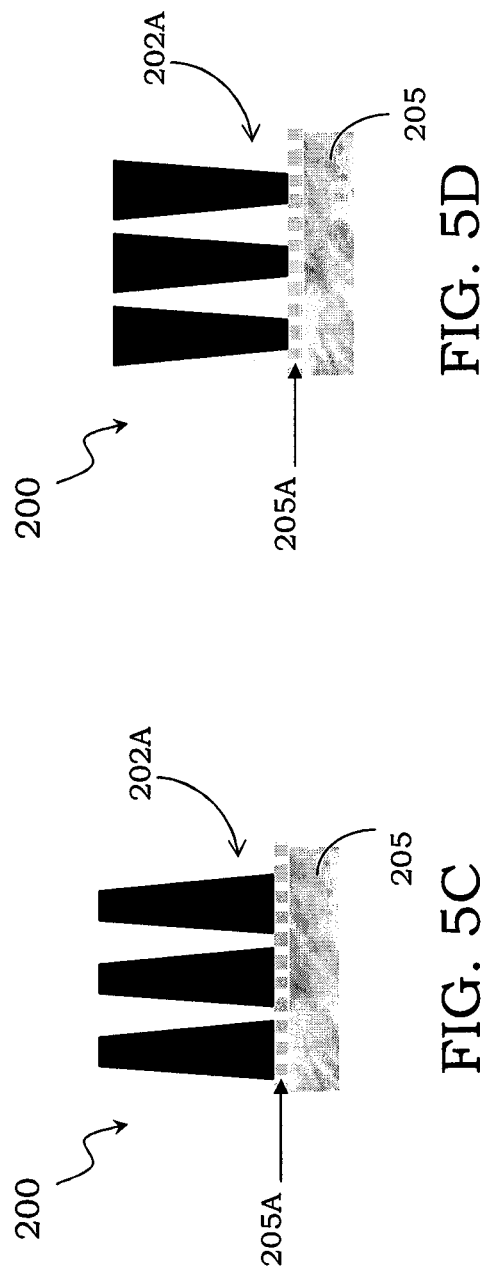

US 9,091,932 B2

THREE-DIMENSIONAL INTEGRATED STRUCTURE HAVING A HIGH SHAPE FACTOR, AND RELATED FORMING METHOD

BACKGROUND

1. Technical Field

The present disclosure relates to a three-dimensional integrated structure having a high shape factor and comprising a plurality of projecting elements obtained by a dry film photoresist.

The disclosure also relates to a method for forming such a three-dimensional integrated structure.

The disclosure refers, in particular, but not exclusively, to a three-dimensional integrated structure to be used in an electronic device, such as a microfluidic device, a microreactor or a sensor device, and comprising at least a substrate and a dry film photoresist, and the following description is made with reference to this field of application just for explanation convenience.

2. Description of the Related Art

As it is well known, dry film photoresists are laminated structures comprising different layers, and in particular a photosensitive material film, duly protected by a carrier film provided on its first or superior surface and a cover film provided on its second or inferior surface. In particular, the carrier film acts as a support for the photosensitive material film, while the cover film acts as a protection of the photosensitive material film until the dry film photoresist is applied on a substrate.

As an example, FIG. 1 shows a dry film photoresist realized according to the prior art and globally indicated with 101. In particular, the dry film photoresist 101 has a multi-layered structure, in particular comprising at least a photo-sensitive material layer or photoresist film 102 as a central layer; a cover film 103, bonded to a first surface of the photoresist film 102 and able to be released to laminate the dry film photoresist 101 on a substrate; and a carrier film 104 bonded to a second surface of the photoresist film 102 and able to be released after the photoexposure of the dry film photoresist 101.

The dry film photoresists are commonly used for optical photolithography, being usable for substrates of any size, nature and form according to a lamination process, similar to the one used for adhesive tapes.

They were introduced by DuPont in 1970 and mostly used for producing printed circuit boards (PCB), for manufacturing micro-mechanical systems (MEMS), for growing metals by electrochemical deposition, and also as permanent materials for bonding devices, in particular for realizing complex three-dimensional structures such as microfluidic devices or microreactors.

It should be remarked that, with respect to conventional liquid resists, dry film photoresists have the advantages of adhering to every type of substrates, which could have different shapes and sizes. These dry film photoresists have a very good thickness uniformity and allow a very high productivity which guarantees safety and low costs of production. In particular, the dry film photoresists can be processed using the multiple steps of roll to roll techniques, obtaining structures having thickness much greater than 100 µm and also comprising buried channels, structures that cannot be realized using liquid resists.

For example, the use of a dry film photoresist is described in the article entitled: "Fast Prototyping Using a Dry Film Photoresist: Microfabrication Of Soft-Lithography Masters for Microfluidic Structures", published in the Journal of Micromechanics and Microengineering 17 (2007) N69-N74. According to this article, a dry film photoresist is used to manufacture soft-lithography masters used in microfluidic applications. In particular, it is indicated therein that the dry film photoresist is a convenient alternative to conventional microfabrication approaches based on liquid resists for fast-prototyping of microfluidic structures.

Dry film photoresists are classified according to two big categories:

aqueous processable dry film photoresists, which are developed in very much diluted solutions of water ($H_2O$) and Sodium Carbonate ($Na_2CO_3$) or of water ($H_2O$) and Potassium Carbonate ($K_2CO_3$);

solvent type dry film photoresists, which are acrylic monomers or polymers, namely comprising the acrylic group $CH_2=CH-C=O$, being able to be developed in polar organic solutions.

Moreover dry film photoresists can be permanent or non-permanent, in case they are left or not in a final electronic device, respectively.

In a well known manner, dry film photoresists are processed according a process comprising the steps of:

removing the cover film from the dry film photoresist;

laminating the dry film photoresist on a substrate, for instance using a pressurized hot roll able to guarantee a good adhesion of the exposed photoresist film to the substrate;

exposing the dry film photoresist for patterning it, for instance by using mask aligners or steppers;

releasing the carrier film from the dry film photoresist, uncovering the photoresist film; and developing the photoresist film.

As an example, FIGS. 2A-2F show the different steps of a method, according to the prior art, for forming a three-dimensional integrated structure 100 for an electronic device comprising a dry film photoresist which is duly patterned, in a negative form with respect to the final three-dimensional integrated structure to be obtained, such dry film photoresist being thus permanent and in particular of the solvent type.

In particular, FIG. 2A shows a first step wherein a dry film photoresist 101 is prepared by releasing its cover film 103 from the photoresist film 102, in particular in a manual or automatic manner.

After that, the method comprises a second step wherein the dry film photoresist 101, comprising the photoresist film 102 and the carrier film 104, is laminated on a substrate 105, in particular in correspondence of a flat surface 105A of the substrate 105 by using a pressurized hot roll 106, as shown in FIG. 2B.

The substrate 105 coupled to the photoresist film 102 is then covered by a mask 107 and subjected to a standard photoexposing step, leading to the patterning of the photoresist film 102, as shown in FIG. 2C. As already underlined, the photoresist film 102 is patterned in a negative form with respect to the final three-dimensional integrated structure to be obtained.

The method then comprises a step wherein the carrier film 104 is released from the photoresist film 102, as shown in FIG. 2D. The release of the carrier film 104 could be made manually or automatically.

Finally, the method comprises a photoresist development step, as shown in FIG. 2E, by using a developer 109. At the end of this step, the photoresist film 102 is removed from the substrate 105 according to its pattern, so as to realize a final three-dimensional integrated structure 100 comprising the substrate 105 and a plurality of elements that project from the flat surface 105A in an opposite direction with respect to the substrate 105, as shown in FIG. 2F. The projecting elements, globally indicated by 102A, are obtained by the duly patterned and developed photoresist film 102.

However, according to the different known methods for developing a photoresist film, a complete cleaning of the substrate 105 is usually not guaranteed.

In particular, several techniques are used to develop the photoresist film.

A first development technique, usually indicated as development in puddle, comprises the steps of:
- spilling the developer one time or more from a programmed mobile nozzle on the substrate, being at rest or moving;
- washing and drying the substrate.

Also known is the so called spray development technique, which comprises the following steps of:
- nebulizing the developer from a nozzle on the substrate, being at rest or moving;
- providing a strong mechanical action for removing the photoresist film and residuals from the substrate surface.

Both these first and second techniques involve a low consumption of the developer and allow to realize the development of the photoresist film as well as the washing and drying of the substrate in a same equipment. Nevertheless, they show several disadvantages, such as a non-uniformity of the distribution of the developer, possible random residuals of photoresist film on the substrate, as well as a low productivity due to the process on a single wafer. They also need specific equipment depending on the shape, size and thickness of the substrate.

Actually, the spray development technique is the most commonly used technique to develop roll photoresists having large thicknesses and it is very useful for defining geometrically complex structures, like coils, spirals and others, on high level topographies, in particular between ten and hundred microns.

Also known is a third development technique which comprises the steps of:
- immerging the substrate inside a crystallizer, for a single wafer process, or inside a tank for wet etch, for a multiple wafer process; and
- developing the photoresist film through chemical developers.

The advantage of this technique is that it guarantees a very high productivity due to the possibility to process substrates having different shape and size, also multiple substrates simultaneously. Nevertheless, the photoresist film being processed according to this technique should have a limited thickness, since otherwise a very long development time would be required. Moreover, at the end of this development technique, the surface of the substrate turns out to be not very well cleaned, so that the lithographic resolution and the size uniformity of the final three-dimensional integrated structure so obtained are very limited.

An alternative embodiment of this type of development technique involves, during the developing step of the photoresist film through chemical developers, the use of ultrasounds generated, for instance, by an ultrasound source (in particular, at a frequency of 40 KHz).

This alternative embodiment has the advantages of allowing a high productivity while obtaining a dimensional uniformity as well as a more efficient removing of residuals from the substrate, due to the vibrations produced by the ultrasounds. Nevertheless, also this alternative embodiment has some drawbacks, mainly due to the more complex equipment to be used, which need an ultrasound generator and also software to provide the suitable programs, in addition to a conventional tank for the wet etch for ensuring a high productivity.

Moreover, acting mechanically on the substrate, this technique turns out to be not adequate for managing fragile, thin and flexible substrates.

The different known methods used for forming a three-dimensional integrated structure comprising projecting elements projecting from a substrate and obtained by a negatively patterned and developed type solvent dry film photoresist have some drawbacks, mainly tied to:
- the difficulty in obtaining shape factors, which is defined as the ratio of the cross section area of the projecting elements to their height, greater than 6; in particular, the shape factors are at present quite far form the shape factors being obtained by using liquid photoresists which are greater than 10;
- the difficulty in obtaining profile of the walls of the projecting elements obtained by the dry film photoresist that could be modified as desired;
- the difficulty in having low cost production.

As it is clear from the above explanation, the most sensitive step of the known methods is tied to the techniques for the development of the photoresist film.

BRIEF SUMMARY

One embodiment of the present disclosure a three-dimensional integrated structure for an electronic device comprising a plurality of projecting elements projecting from a substrate and obtained by a negatively patterned and developed dry film photoresist having functional and structural characteristics allowing to overcome the limits which still affect the structures and methods previously disclosed with reference to the prior art.

One embodiment of the present realizes a negatively patterned type solvent dry film photoresist which is highly defined. In particular, the projecting elements obtained by the dry film photoresist being duly patterned and developed have a shape factor greater than 6 and a profile that can be modulated.

One embodiment of the present disclosure is a three-dimensional integrated structure comprising a substrate and a plurality of projecting elements projecting from a flat surface thereof and made of a patterned and developed dry film photoresist, characterized in that said three-dimensional integrated structure is highly defined, the projecting elements made of the patterned and developed dry film photoresist having a shape factor greater than 6.

More in particular, the disclosure comprises the following supplemental and optional features, taken alone or in combination when needed.

According to an aspect of the disclosure, the projecting elements made of the patterned and developed dry film photoresist may have a shape factor comprised in the range 6-10.

According to another aspect of the disclosure, the projecting elements made of the patterned and developed dry film photoresist may have a shape factor equal to 10.

Moreover, according to a further aspect of the disclosure, the projecting elements made of the patterned and developed dry film photoresist may have a modulable profile.

According to another aspect of the disclosure, the substrate may be a semiconductor wafer.

According to yet another aspect of the disclosure, the substrate may be chosen between a silicon substrate, a glass substrate, another material having structural features similar to silicon or glass or a flexible plastic foil.

Furthermore, according to an aspect of the disclosure, the three-dimensional integrated structure may be free of polymeric residuals of the patterned and developed dry film photoresist.

Also according to an aspect of the disclosure, the projecting elements made of the patterned and developed dry film photoresist may have vertical walls being either substantially perpendicular, having a negative slope or having a positive slope with respect to the flat surface of the substrate.

One embodiment is an electronic device comprising at least a three-dimensional integrated structure realized as above described.

According to this aspect of the disclosure, the electronic device may be chosen between a microfluidic device, a microreactor or a sensor device.

One embodiment of the present disclosure is a method for forming a three-dimensional integrated structure comprising a substrate and a plurality of projecting elements that project from a flat surface of the substrate, the method comprising the steps of:
providing the substrate;
providing a dry film photoresist comprising at least a photoresist film on the flat surface of the substrate;
patterning the photoresist film in a negative form with respect to the three-dimensional integrated structure to be obtained; and
developing the photoresist film by immersing the substrate covered with the photoresist film in a developer solution.

The step of developing the photoresist film comprises producing said projecting elements made of the patterned and developed photoresist film with a shape factor greater than 6 by using a special developer solution comprising a standard developer solution and at least an additional component for facilitating the dissolving action of the standard developer solution on the photoresist film.

According to an aspect of the disclosure, the step of developing the photoresist film may comprise using a remover as additional component.

According to another aspect of the disclosure, the additional component acts on the photoresist film outside the patterned portions thereof, so as to leave said projecting elements made of the patterned and developed photoresist film and fully remove the photoresist film from a remaining portion of the substrate not covered by the projecting elements made of the patterned and developed photoresist film.

Moreover, according to another aspect of the disclosure, the developer solution may comprise the additional component in a percentage comprised in the range of 5-20%, and preferably equal to 10%.

According to an aspect of the disclosure, the method may further comprise a step of changing a percentage of the additional component within the developer solution to modify a profile of the projecting elements made of the patterned and developed photoresist film.

According to another aspect of the disclosure, the method may further comprise a step of changing a type of the additional component within the developer solution to modify a profile of the projecting elements made of the patterned and developed photoresist film.

According to yet another aspect of the disclosure, the remover may be a component chosen in the group comprising:
acetone;
a combination of 1-methoxy-2-propanol-acetate, 2-pentanone and ethyl-lactate; and
a combination of 1-methoxy-2-propanol-acetate, methyl-ethyl-ketone and ethyl-lactate.

Moreover, according to another aspect of the disclosure, the step of providing the dry film photoresist may comprise a step of laminating the dry film photoresist on the flat surface of the substrate.

Finally, according to still another aspect of the disclosure, the patterning step may comprise exposing the photoresist film covered by a hard mask shaped in a negative form with respect to the three-dimensional integrated structure to be obtained.

The characteristics and advantages of the three-dimensional integrated structure according to the present disclosure and of its forming method will be apparent from the following description of an embodiment thereof given by way of indicative and non-limiting example with reference to the annexed drawings.

BRIEF DESCRIPTION OF THE SEVERAL VIEWS OF THE DRAWINGS

In such drawings:

FIGS. 2A-2F schematically show different steps of a method for forming a three-dimensional integrated structure using a duly patterned and developed dry film photoresist, according to the prior art;

FIGS. 5A-5D schematically show alternative embodiments of the three-dimensional integrated structure of FIG. 3;

DETAILED DESCRIPTION

Figure 1:
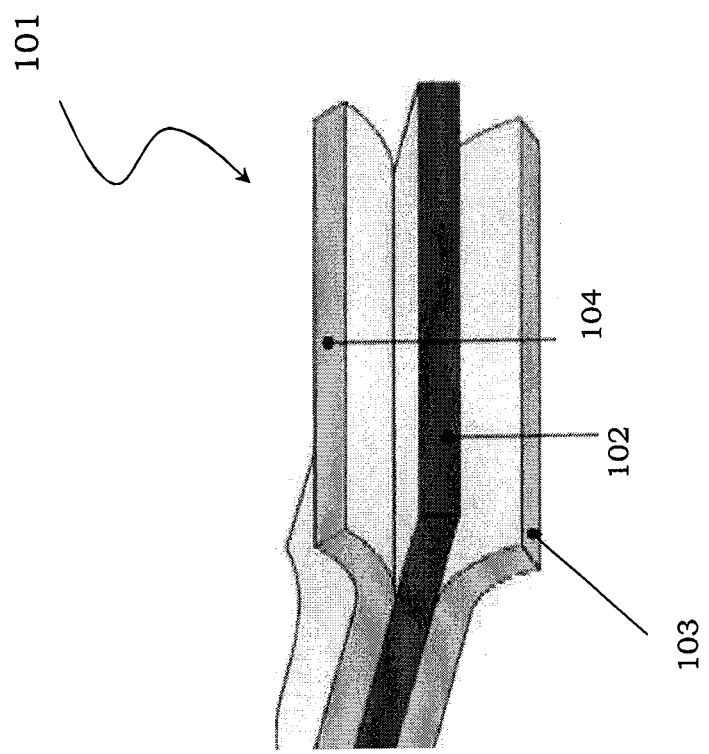
FIG. 1 schematically shows a structure of a dry film photoresist, realized according to the prior art.
Figure 3:
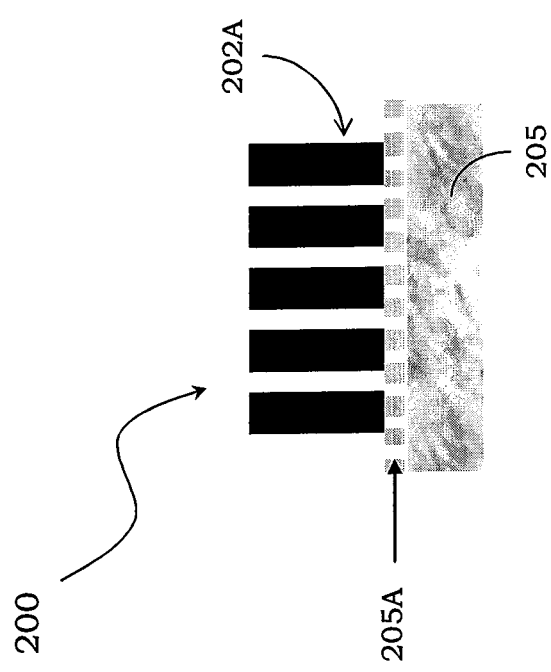
FIG. 3 schematically shows a three-dimensional integrated structure realized according to the disclosure.

With reference to such figures, and in particular to FIG. 3, a three-dimensional integrated structure 200 comprising a substrate 205 and a plurality of elements 202A projecting from a flat surface 205A of the substrate. As will be clear from the following description of the method for forming the three-dimensional integrated structure 200-, the projecting elements 202A are obtained by a dry film photoresist 202 which has been attached to the substrate 205, duly patterned in a negative form with respect to the three-dimensional integrated structure 200 to be obtained and developed. In particular, the dry film photoresist 202 is thus of the permanent type. Moreover, according to an aspect of the disclosure, the dry film photoresist 202 is of the solvent type.

It should be noted that the process steps being described hereinafter do not deal with a complete manufacturing process of a wafer. The present disclosure can be carried out along with integrated circuit manufacturing techniques usually employed in the field.

Moreover, figures showing schematic views of the integrated structure during the manufacturing are not drawn in scale, being on the contrary drafted so as to emphasize the important features of the disclosures.

According to an aspect of the disclosure, the substrate 205 may be a semiconductor wafer or any other alternative wafer being normally used in the microelectronic field.

More in particular, according to a preferred embodiment of the disclosure, the substrate 205 may be either a silicon substrate or a glass substrate or another material having structural features, such as shape, weight and dimensions, similar to silicon or glass.

According to another aspect of the disclosure, the substrate 205 may be a flexible plastic foil.

The disclosure relates to a method for forming the three-integrated dimensional structure 200 and comprising different steps, being described hereinbelow with reference to FIGS. 4A-4D.

Figure 4A:
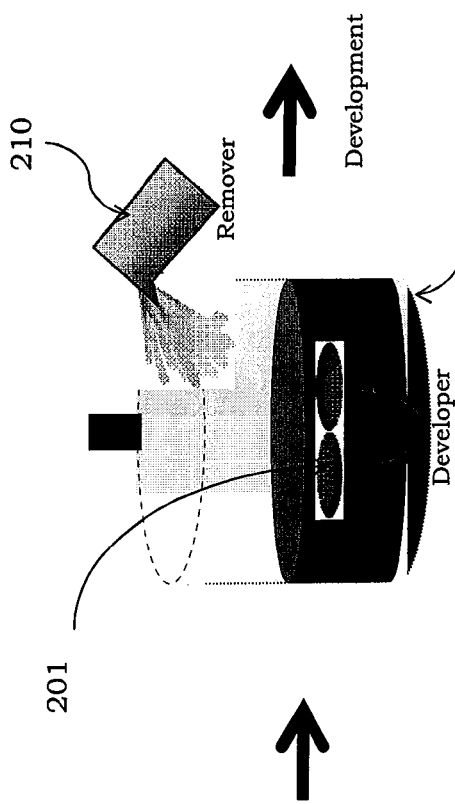
FIGS. 4A-4D schematically show different steps of a method for forming the three-dimensional integrated structure of FIG. 3, according to the present disclosure.
Figure 4B:
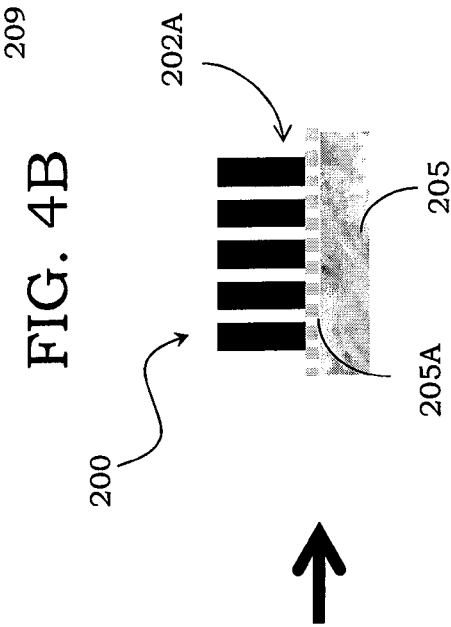
Figure 4C:
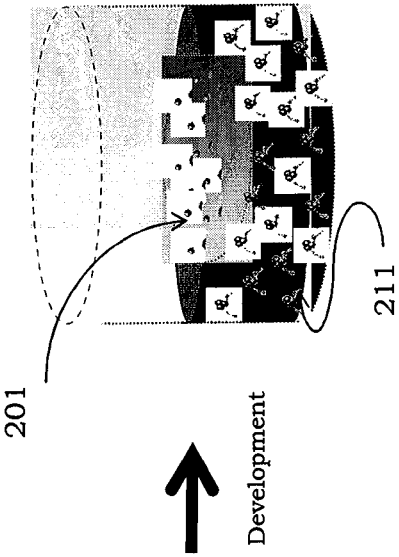

An initial structure 201, comprising the substrate 205 and a dry film photoresist 202 attached thereto in correspondence of its flat surface 205A is shown in FIG. 4A. This initial structure 201 is then immerged in a special developer solution 211, as shown in FIGS. 4B and 4C.

According to an aspect of the disclosure, the special developer solution 211 comprises a standard developer solution 209 and a remover 210, namely a chemical component able to remove the dry film photoresist 202.

Figure 4D:
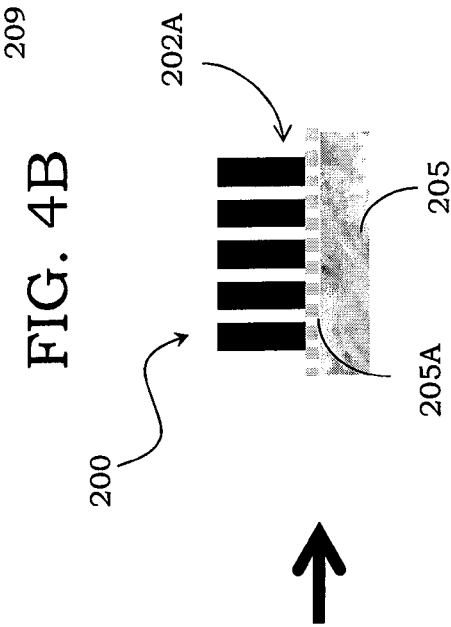

FIG. 4D shows the resulting three-dimensional integrated structure 200 comprising the substrate 205 and the plurality of projecting elements 202A from its flat surface 205A, these elements having been obtained from the dry film photoresist 202, which has been duly patterned in a negative form with respect to the final three-dimensional integrated structure 200 to be obtained and developed. In particular, the dry film photoresist 202 is a permanent type solvent dry film photoresist.

According to an aspect of the disclosure, the projecting elements 202A obtained by the dry film photoresist 202 have a shape factor greater than 6, as shown for instance in FIG. 5A.

According to another aspect of the disclosure, the projecting elements 202A obtained by the dry film photoresist 202 have a shape factor equal to 7,8.

According to yet another aspect of the disclosure, the projecting elements 202A obtained by the dry film photoresist 202 have a shape factor in the range between 6 and 10, in particular equal to 10.

Moreover, according to an aspect of the disclosure, the projecting elements 202A obtained by the dry film photoresist 202 have vertical walls substantially perpendicular to the flat surface 205A of the substrate 205, as shown in FIG. 5B.

According to another aspect of the disclosure, the projecting elements 202A obtained by the dry film photoresist 202 have vertical walls with a positive slope, as shown in FIG. 5C.

According to yet another aspect of the disclosure, the projecting elements 202A obtained by the dry film photoresist 202 have vertical walls with a negative slope, as shown in FIG. 5D.

Moreover, according to an aspect of the disclosure, the three-dimensional integrated structure 200 has a highly defined three-dimensional profile, free of polymeric residuals.

It should be remarked that the three-dimensional integrated structure 200 according to the disclosure can be used to directly realize different type of electronic devices.

According to an aspect of the disclosure, an electronic device, such as a microfluidic device, comprises the three-dimensional integrated structure 200.

According to another aspect of the disclosure, an electronic device, such as a microreactor, comprises the three-dimensional integrated structure 200.

According to yet another aspect of the disclosure, an electronic device, such as a sensor device, comprises the three-dimensional integrated structure 200.

The present disclosure also relates to a method for forming a three-dimensional integrated structure 200 comprising a substrate 205 and a plurality of projecting elements 202A projecting from a flat surface 205A of the substrate 205. The method comprising the steps of:
  providing the substrate 205;
  providing a dry film photoresist 201 comprising at least a photoresist film 202 on the flat surface 205A of the substrate 205;
  patterning the photoresist film 202 in a negative form with respect to the three-dimensional integrated structure 200 to be obtained; and
  developing the photoresist film 202 by immersing the substrate 205 covered with the photoresist film 202 in a special developer solution 211 able to produce a highly defined three-dimensional integrated structure 200 comprising a plurality of projecting elements 202A projecting from the substrate 205 and obtained by the photoresist film 202.

The method comprises an immersion step which is provided in a special developer solution comprising a determined percentage of a chemical component, called remover, able to guarantee a correct cleaning of the substrate and thus a high definition of the projecting elements obtained by the dry film photoresist provided onto the substrate and duly patterned and developed depending on the three-dimensional integrated structure to be obtained.

In particular, the step of providing the dry film photoresist 201 comprises a step of laminating the dry film photoresist 201 on the flat surface 205A of the substrate 205.

Moreover, according to another aspect of the disclosure, the patterning step may comprise exposing the photoresist film 202 covered by a mask shaped in a negative form with respect to the three-dimensional integrated structure 200 to be obtained.

As a skilled person in the art may appreciate, not all the above phases may be strictly necessary for obtaining the final result of the highly defined three-dimensional integrated structure 200.

According to an aspect of the disclosure, the special developer solution 211 comprises a standard developer solution 209 and an additional component, in particular a remover 210.

In particular, the presence of the remover 210 along with the developer solution 209 within the special developer solution 211 is used to facilitate the dissolving action of the developer solution 209 and ensuring a correct high definition of the three-dimensional integrated structure 200.

According to an aspect of the disclosure, the remover 210 is added to the developer solution 209 in a percentage comprised in the range 5-20% and preferably equal to 10%, thus obtaining the special developer solution 211.

According to another aspect of the disclosure, the method comprises a step of changing the percentage of the remover 210 within the special developer solution 211 so as to modify the profile of the projecting elements 202A obtained by the photoresist film 202.

According to yet another aspect of the disclosure, the method comprises a step of changing the type of the remover 210 within the special developer solution 211 so as to modify the profile of the projecting elements 202A obtained by the photoresist film 202.

According to another aspect of the disclosure, the remover 210 comprises acetone.

According to yet another aspect of the disclosure, the remover 210 comprises a combination of 1-methoxy-2-propanol-acetate, 2-pentanone and ethyl-lactate.

According to a further aspect of the disclosure, the remover 210 comprises a combination of 1-methoxy-2-propanol-acetate, methyl-ethyl-ketone and ethyl-lactate.

It should be underlined that the remover 210 empowers the dissolution action performed by the developer solution 209, releasing some portions of the photoresist film 202 inside the special developer solution 211, and maintaining the complementary portions of the photoresist film 202 on the substrate 205, i.e., the projecting elements 202A, so that the surface of the substrate 205 is very well cleaned outside the projecting elements 202A.

It should be also noted that, advantageously according to the disclosure, the development of the photoresist film 202 is very fast, in the order of few minutes. In particular, for a wafer of 6" immerged in 200 ml of developer solution, the development step is 5 minutes long.

Figure 6B:
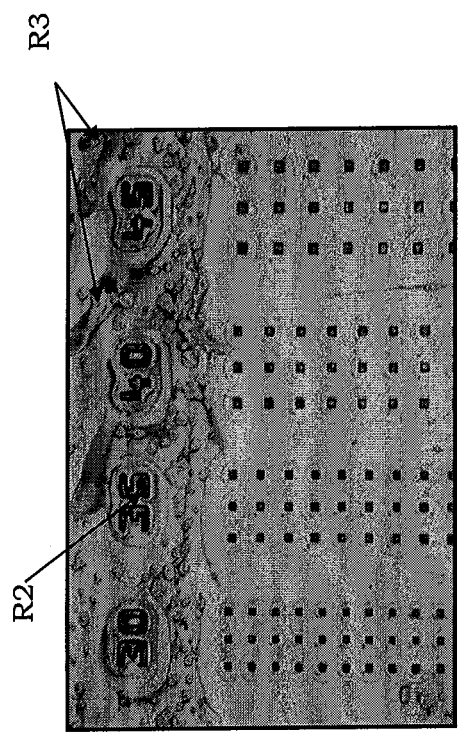
FIGS. 6A and 6B schematically show photographs of a wafer comprising a three-dimensional integrated structure, being obtained according to the prior art.
Figure 6A:
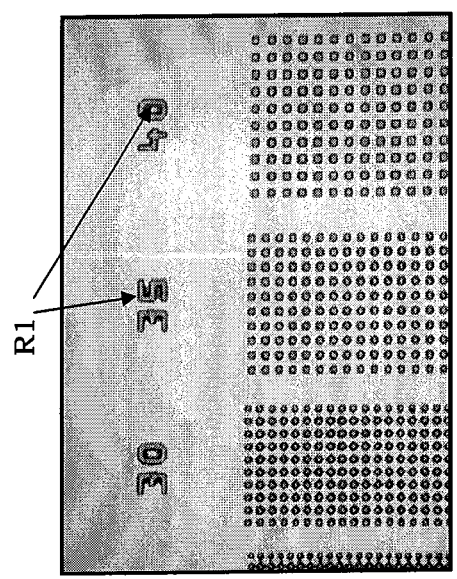

FIGS. 6A and 6B shows photographs showing a wafer comprising a three-dimensional integrated structures obtained respectively with the standard spray development method (FIG. 6A) and with the immersion development with a known developer solution (FIG. 6B).

Figure 6C:
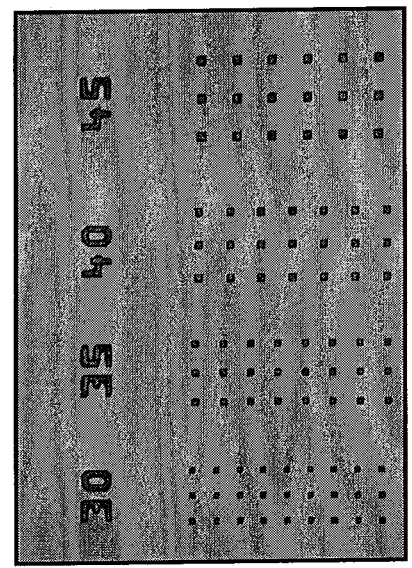
FIG. 6C schematically shows a photograph of a wafer comprising a three-dimensional integrated structure, being obtained according to the disclosure.

FIG. 6C shows a photograph of a wafer comprising a three-dimensional integrated structure obtained with the method based on the immersion development with a special developer solution according to the disclosure.

By comparing these photographs, it can be verified that the three-dimensional integrated structure obtained on the wafer with the immersion development method with a standard developer solution (FIG. 6B) is not very well cleaned, and in particular comprises residuals, indicated with R2 and R3.

Moreover, although the three-dimensional integrated structure obtained with spray development method (FIG. 6A) is very well cleaned, it however shows some polymeric residuals, indicated by R1, that limit the lithographic resolution on closed structures, like contacts, and more complex, like coils, spirals, bends, etc.

Only the three-dimensional integrated structure obtained with the method according to the disclosure (FIG. 6C), based on the immersion development with the special developer solution as above described, is much more defined and cleaned than the structures obtained with the methods of the prior art.

The advantages of the proposed three-dimensional integrated structure and of the corresponding forming method emerge clearly from the foregoing discussion.

In particular, advantageously according to the present disclosure, no need is felt of having specific equipment for the photoresist development. In fact, a simple crystallizer can be used to perform the development phase.

In addition, advantageously according to the disclosure, it is possible to process simultaneously and quickly multiple wafers using a tank for wet etch.

Another advantage relates to the possibility to process, also simultaneously, substrates having different shapes and dimensions, even if they are fragile, thin or flexible.

In particular, it should be remarked that the development process is made at room temperature, not requiring any kind of heating.

Another advantage relates to the simple, fast, efficient and economic process being used, which would thus reduce the fabrication costs.

In addition, advantageously according to the disclosure, the remover percentage is optimized to guarantee an efficient surface cleaning without etching the projecting elements of the photoresist film that should be left permanently inside the final structure and thus to an electronic device comprising it.

Moreover, these projecting elements have a highly defined profile, in terms of high shape factors, even able to be modulated.

Obviously, a technician of the field, aiming at meeting incidental and specific needs, will bring several modifications to the above described three-dimensional integrated structure and forming method, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a three-dimensional integrated structure having a substrate and a plurality of projecting elements projecting from a flat surface of said substrate, the forming including:
    forming a dry film photoresist film on said flat surface of said substrate; and
    forming the projecting elements from the dry film photoresist film, said projecting elements having a shape factor greater than 6, wherein forming the projecting elements includes:
    patterning said photoresist film in a negative form with respect to said three-dimensional integrated structure to be obtained; and
    developing said photoresist film by immersing said substrate covered with said photoresist film in a developer solution; the developer solution including a developer and remover configured to facilitate a dissolving action of said developer on said photoresist film, wherein said remover includes a solvent selected from the group consisting of:
    acetone;
    a combination of 1-methoxy-2-propanol-acetate, 2-pentanone and ethyl-lactate; and
    a combination of 1-methoxy-2-propanol-acetate, methyl-ethyl-ketone and ethyl-lactate.

2. The method according to claim 1, wherein the developer solution includes a percentage of the remover, the method further comprising changing the percentage of said remover within said developer solution to modify a profile of said projecting elements made of the patterned and developed photoresist film.

3. The method according to claim 1, wherein said patterning comprises:
    covering said photoresist film with a hard mask shaped in a negative form with respect to said three-dimensional integrated structure to be obtained; and
    exposing said photoresist film while the photoresist film is covered with the hard mask.

4. The method according to claim 1, wherein forming said dry film photoresist comprises laminating said dry film photoresist film on said flat surface of said substrate.

* * * * *